United States Patent
Xu

(10) Patent No.: US 10,734,239 B2
(45) Date of Patent: Aug. 4, 2020

(54) HIGH-CHI BLOCK COPOLYMERS WITH TUNABLE GLASS TRANSITION TEMPERATURES FOR DIRECTED SELF-ASSEMBLY

(71) Applicant: Brewer Science, Inc., Rolla, MO (US)

(72) Inventor: Kui Xu, Rolla, MO (US)

(73) Assignee: Brewer Science, Inc., Rolla, MO (US)

(*) Notice: Subject to any disclaimer, the term of this patent is extended or adjusted under 35 U.S.C. 154(b) by 0 days.

(21) Appl. No.: 15/909,751

(22) Filed: Mar. 1, 2018

(65) Prior Publication Data
US 2018/0254189 A1 Sep. 6, 2018

Related U.S. Application Data

(60) Provisional application No. 62/465,328, filed on Mar. 1, 2017.

(51) Int. Cl.
*H01L 21/308* (2006.01)
*H01L 21/311* (2006.01)
(Continued)

(52) U.S. Cl.
CPC ......... *H01L 21/3088* (2013.01); *C08F 2/38* (2013.01); *C08F 12/08* (2013.01); *C08F 220/14* (2013.01);
(Continued)

(58) Field of Classification Search
CPC ............ H01L 21/0271; H01L 21/0338; H01L 21/02282; H01L 21/3088; H01L 21/02118;
(Continued)

(56) References Cited

U.S. PATENT DOCUMENTS 9,574,104 B1 * 2/2017 Kim .................... G03F 7/40
9,768,059 B1 * 9/2017 Liu .................. H01L 21/31144
(Continued)

OTHER PUBLICATIONS

Stuhn, The Relation Between the Microphase Separation Transition and the Glass Transition in Diblock Copolymers, University of Freiburg, Freiburg, Germany, Jan. 13, 1992. (Year: 1992).*
(Continued)

*Primary Examiner* — Robert G Bachner
(74) *Attorney, Agent, or Firm* — Hovey Williams LLP

(57) ABSTRACT

Directed self-assembly (DSA) using block copolymers (BCPs) is emerging as a viable alternative to photolithography for creating features 10 nm and smaller. Block copolymers with balanced surface energy between the polymer blocks, tunable $\chi$, and tunable glass transition temperatures ($T_g$) have been formulated. The block copolymers can achieve perpendicular orientation by simple thermal annealing due to the surface energy balance between the polymer blocks, which allows avoiding solvent annealing or top-coat. The $\chi$ value can be tuned up to achieve $L_0$ as low as 12 nm for lamellar-structured BCPs and hole/pillar size as small as 6 nm for cylinder-structured BCPs. The Tg of the BCPs can also be tuned to lower than those of PS-b-PMMA standards. The enhanced polymer chain mobility resulting from the decreased Tg of the block copolymer may help with improving the kinetics of BCP self-assembly during the thermal annealing.

32 Claims, 1 Drawing Sheet

Figure 1:
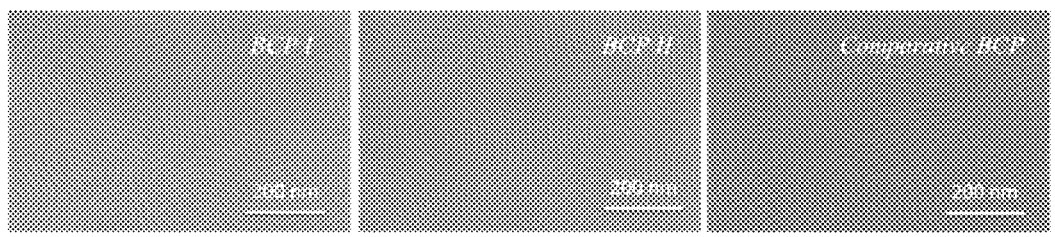

(51) Int. Cl.
*H01L 21/027* (2006.01)
*C08F 12/08* (2006.01)
*C08F 220/14* (2006.01)
*C08G 81/02* (2006.01)
*H01L 21/3213* (2006.01)
*C08F 293/00* (2006.01)
*C08F 2/38* (2006.01)

(52) U.S. Cl.
CPC ........ *C08F 293/005* (2013.01); *C08G 81/021* (2013.01); *H01L 21/0274* (2013.01); *H01L 21/3081* (2013.01); *H01L 21/3086* (2013.01); *H01L 21/31144* (2013.01); *H01L 21/32139* (2013.01); *C08F 2438/03* (2013.01); *C08F 2500/03* (2013.01)

(58) Field of Classification Search
CPC . H01L 27/1462; H01L 21/027; H01L 21/308; H01L 27/11582; H01L 21/31116; H01L 21/32136; H01L 23/3171; H01L 21/67069; H01L 21/31122; H01L 21/32137; H01L 27/11556; H01L 23/291; H01L 21/3081; H01L 21/3086; H01L 21/31144; H01L 21/0274; H01L 21/32139; H01L 51/5056; H01L 51/5072; H01L 51/5092; H01L 51/5016; H01L 21/76897; H01L 51/0072; H01L 51/5088; C08F 12/08; C08F 220/14; C08F 2500/03; C08F 8/00; C08F 112/08; C08F 212/14; C08F 120/14; C08F 212/12; C08F 220/24; C08F 220/18; C08F 2810/40; C08F 12/14; C08F 12/20; C08F 20/18; C08F 20/22; C08F 20/26; C08F 212/08; C08F 220/12; C08F 220/30; C08F 2220/302; C08F 26/06; C08G 81/021; G03F 7/0045; G03F 7/038; G03F 7/039; G03F 7/0002; G03F 7/16; G03F 7/20; G03F 7/2004; G03F 7/325; G03F 7/38

See application file for complete search history.

(56) References Cited

U.S. PATENT DOCUMENTS

| | | |
|---|---|---|
| 2013/0273330 A1 | 10/2013 | Wang et al. |
| 2016/0244581 A1* | 8/2016 | Brink .................. B05D 3/0453 |
| 2018/0163003 A1 | 6/2018 | Sweat et al. |

OTHER PUBLICATIONS

Zhao et al., "Synthesis of Phenol, Aromatic Ether, and Benzofuran Derivatives by Copper-Catalyzed Hydroxylation of Aryl Halides," Angewandte Chemi International Edition, 2009, 48 (46): 8729-8732.

Chapin et al., "The Preparation and Polymerization of p-Vinylbenzyl Ethers," J. Organic Chemistry, 1962, 27 (7): 2595-2597.

Murphy et al., "Automated Defect and Correlation Length Analysis of Block Copolymer Thin Film Nanopatterns," PLOS, Jul. 24, 2015, https://doi.org/10.1371/journal.pone.0133088.

\* cited by examiner

HIGH-CHI BLOCK COPOLYMERS WITH TUNABLE GLASS TRANSITION TEMPERATURES FOR DIRECTED SELF-ASSEMBLY

RELATED APPLICATION

The present application claims the priority benefit of U.S. Provisional Patent Application Ser. No. 62/465,328, filed Mar. 1, 2017, entitled HIGH-CHI BLOCK COPOLYMERS WITH TUNABLE GLASS TRANSITION TEMPERATURE FOR DIRECTED SELF-ASSEMBLY, incorporated by reference in its entirety herein.

BACKGROUND OF THE INVENTION

Field of the Invention

This invention pertains to polymers for use in the block copolymer materials used in directed self-assembly.

Description of the Prior Art

The increasing demand of smaller micro-fabricated devices requires a continuous decrease in the feature size of device components. Conventional photolithography techniques become increasingly difficult and costly as the feature size approaches 22 nm and smaller. To keep Moore's law moving forward, non-lithography techniques will become more and more important. An alternative approach to generate nanoscale patterns is directed self-assembly ("DSA") of block copolymers ("BCPs"), which can feasibly provide highly ordered patternable morphologies such as lamellae and cylinders at a molecular level (<20 nm).

Currently, the use of DSA for generating lines and spaces utilizing conventional polystyrene ("PS") and poly(methylmethacrylate) block copolymer ("PS-b-PMMA") has shown to be in the critical dimension range of 12-20 nm pitch. A range of methods using both chemoepitaxy and graphoepitaxy pre-patterning process flows have been successful for creating both lines and spaces ("lamellae") and contact holes ("cylinders"). In contrast, the resolution limit for single patterning 193 nm immersion scanners is 37 nm for dense lines and spaces and 40 nm for contact openings.

Typical DSA process flows incorporate several layers. DSA of BCPs is typically performed on an organic, neutral "brush" layer. This brush layer is usually a random copolymer of styrene and methyl methacrylate ("PS-r-PMMA") that has been cured over a long period of time. The block copolymer DSA formulations are then coated on top of the brush layer and annealed. The annealing process causes the block copolymer to arrange itself into alternating organized structures. Optionally, a bottom anti-reflective coating is used to control reflection control of a pre-pattern. This pre-pattern is often formed by standard photolithography techniques, such as the patterning of a photoresist. Etch block layers are also included under the DSA layers to facilitate the pattern transfer process (a silicon- or metal-containing hardmask ("HM") such as $SiO_2$ or TiN). Another etch transfer layer, such as spin-on carbon ("SOC"), may also be under the HM layer in the DSA stack.

Current DSA process flows utilize BCP DSA formulations that are coated to a thickness of around 200-1,000 Å and annealed. After successful annealing, one of the blocks can then be etched away with the remaining block used as an etch block for the underlying layers or substrate. In a typical PS-b-PMMA BCP formulation, the PMMA etches faster than PS in dry etch conditions. The PMMA is typically all removed while the PS remains on the substrate.

PS-b-PMMA is currently the most widely used and studied BCP material for DSA patterning. However, PS-b-PMMA has a notable limitation, in that it has a relatively low Flory-Huggins interaction parameter, $\chi$, which is the measure of block incompatibility in BCPs. As a result of a low $\chi$, standard PS-b-PMMA has inherent feature size limitations. A higher $\chi$, which brings stronger phase separation between the blocks in the BCP, is desired for obtaining smaller features, better line-edge roughness, and less defects at equilibrium. So-called "high-$\chi$" BCPs are thus getting a great deal of attention. Unfortunately, most high-$\chi$ BCPs reported so far lack the most intriguing advantage that PS-b-PMMA has, which is that the two polymer blocks have equal surface energy at common annealing temperatures and can thus achieve perpendicular orientation as generally desired for patterning by simple thermal annealing. An additional top-coat or solvent annealing is usually used to help high-$\chi$ BCPs get a perpendicular orientation. However, top-coat and solvent annealing add additional costs and process challenges to current DSA processing.

Keys to successfully integrate DSA for advanced patterning include the ability to achieve low defect density (e.g. <0.01 defect/$cm^2$) under acceptable processing conditions (e.g. time and temperature). Theoretically, a higher $\chi$, which means a stronger drive to self-assemble, will lead to fewer defects at equilibrium. However, an unfortunate consequence associated with high $\chi$ for practical applications of DSA is the slowing kinetics of polymer diffusion during thermal annealing. The ability of the BCP to eliminate defects through thermal annealing decreases with increasing $\chi N$, where $\chi N$ is the product of $\chi$ and N, and N is the polymerization degree. $\chi N$ indicates the driving force for the phase separation of the block copolymers. This means that although high $\chi$ can offer fewer defects at equilibrium, the slowing kinetics is an obstacle to actually achieve this benefit within reasonable time scales by thermal annealing.

SUMMARY OF THE INVENTION

The present invention broadly provides methods of forming microelectronic structures using new DSA compositions. The method comprises providing a stack comprising a substrate having a surface and one or more optional intermediate layers on the substrate surface. A composition is applied to the intermediate layers, if present, or to the substrate surface, if no intermediate layers are present. The composition comprises a block copolymer comprising a first block and a second block, with the first block being selected from the group consisting of:

(I) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof; and (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof.

The composition is then caused to self-assemble into a self-assembled layer. The self-assembled layer comprises a first self-assembled region and a second self-assembled region different from the first self-assembled region.

In another embodiment, a microelectronic structure is provided. The structure comprises:
- a substrate having a surface;
- one or more optional intermediate layers on the substrate surface; and
- a layer of a self-assembling composition formed on the one or more optional intermediate layers, if present, or on the substrate surface, if no intermediate layers are present.

The self-assembling composition comprises a block copolymer comprising a first block and a second block, the first block being selected from the group consisting of:
- (I) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof; and
- (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof.

In another embodiment, the invention provides a composition comprising a block copolymer dissolved or dispersed in a solvent system. The block copolymer comprises a first block and a second block. The first block selected from the group consisting of:
- (I) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof; and
- (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof.

The second block is selected from the group consisting of: the other of polymer (I) or (II) (i.e., whichever polymer was not the first block); and polymers comprising recurring monomers of methyl methacrylate, methacrylate-containing monomers, styrene, styrene-containing monomers, and mixtures thereof.

BRIEF DESCRIPTION OF THE DRAWING FIGURES

Figure 2:
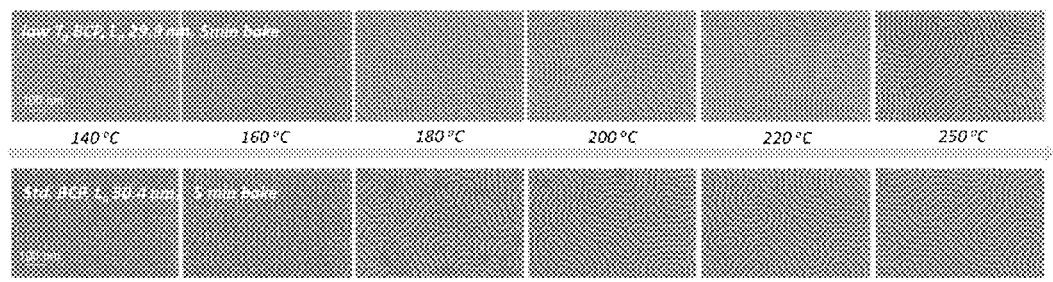

FIG. 1 shows SEM images (200KX) of the BCPs from Examples 1 and 2 and the comparative BCP from Example 3; and FIG. 2 compares SEM images (200KX) of the BCPs from Examples 4 and 5 after 5 minutes thermal annealing at various temperatures.

DETAILED DESCRIPTION OF THE PREFERRED EMBODIMENTS

The present invention provides high-$\chi$ BCP materials for BCP-DSA lithography, and more specifically di-block copolymers with organic polymer blocks, e.g., PS and PMMA analogues, that can be easily synthesized by controlled radical polymerization techniques. Functional monomers have been incorporated into the polymer blocks for tuning the surface energy balance, the glass transition temperature ("$T_g$"), and the $\chi$.

In more detail, compositions for use in the present invention are DSA compositions and include a block copolymer (typically a diblock copolymer) dissolved or dispersed in a solvent system. In general, DSA compositions contain two or more immiscible compounds (e.g., polymer blends) or a self-assembling compound comprising at least two components having distinct (and often opposite) characteristics, such as functionality, polarity, water affinity, etch resistance, etc., which allow segregation (essentially nanophase separation) and alignment of the two compounds or components in a rational manner, as well as selective removal of one compound or component. Block copolymers, as noted above, are particularly well-suited to DSA techniques, as they can be synthesized containing at least two distinct blocks, allowing for each component to align under appropriate conditions, and to be selectively removed after alignment. Suitable block copolymers for use in the present invention should contain two or more blocks of polymers that self-assemble at the appropriate time (e.g., when annealed). The block copolymer comprises first and second blocks.

Inventive Block Copolymers

1. Styrene as First Block Embodiment

In one embodiment, the first block is a polymer comprising random monomers of styrene, a monomer other than styrene, and a $T_g$-lowering monomer selected from the group consisting of 4-alkyl (preferably $C_1$-$C_6$) styrenes, 3-alkyl (preferably $C_1$-$C_6$) styrenes, 4-alkoxy (preferably $C_1$-$C_6$) styrenes, 3-alkoxy (preferably $C_1$-$C_6$) styrenes, alkyl (preferably $C_1$-$C_6$) vinylbenzyl ethers, vinylbenzyl ethers, and mixtures thereof. As noted, the alkyl styrenes, alkoxy styrenes, alkyl vinylbenzyl ethers, and vinylbenzyl ethers lower the $T_g$ of the first block of the BCP. Preferably, the alkyl styrene is of the formula $C_nH_{2n+1}$, where n≥1, and preferably from 1 to about 6. Preferably, the alkoxy styrene is of the formula $C_nH_{2n+1}O$, where n≥1, and preferably from 1 to about 6.

When alkyl vinylbenzyl ethers are used, one preferred formula is

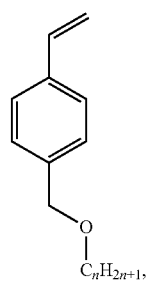

where n≥1, and preferably from 1 to about 6.

When vinylbenzyl ether monomers are used, preferred monomers include those selected from the group consisting of

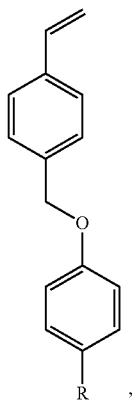

where R is selected from the group consisting of —CH$_3$, —C$_n$H$_{2n+1}$, —OC$_n$H$_{2n+1}$,

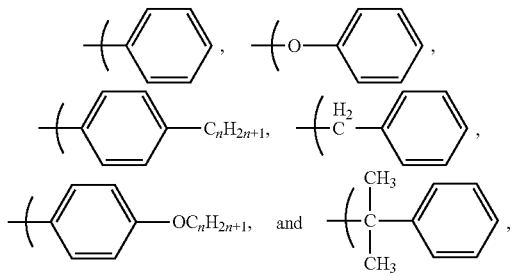

where n≥1, and preferably from 1 to about 6.

The "monomers other than styrene" that may be included in the first block include those selected from the group consisting of 2-methyl styrene, 3-methyl styrene, 4-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, and mixtures thereof.

The molar percentage of T$_g$-lowering monomer in the first block of this embodiment can be from about 5% to about 90%, preferably from about 10% to about 80%, and more preferably from about 10% to about 50%. The molar percentage of styrene in the first block of this embodiment can be from about 5% to about 90%, preferably from about 20% to about 80%, and more preferably from about 20% to about 60%. The molar percentage of the monomer other than styrene in the first block of this embodiment can be from about 5% to about 90%, preferably from about 10% to about 80%, and more preferably from about 10% to about 40%. These molar percentages are based on the first block taken as 100%.

In this embodiment, the second block is a polymer comprising random monomers selected from the group consisting of methacrylates and methacrylate-containing monomers (such as methyl methacrylate, ethyl methacrylate, methoxy ethyl methacrylate, hydroxyethyl methacrylate, hydroxypropyl methacrylate, 3-hydroxypropyl methacrylate, di(ethylene glycol) methyl ether methacrylate, and poly(ethylene glycol) methacrylate), acrylates and acrylate-containing monomers (such as methyl acrylate, methyl ether acrylate, ethyl acrylate, methoxy ethyl acrylate, di(ethylene glycol) methyl ether acrylate, poly(ethylene glycol) acrylate, and hydroxypropyl acrylate), methacrylic acid, acrylic acid, lactic acid, ethylene oxide, vinyl ester, vinyl amide, and combinations thereof.

2. Methacrylate as First Block Embodiment

In another embodiment, the first block is a polymer comprising random monomers of methyl methacrylate, a monomer other than methyl methacrylate, and a T$_g$-lowering monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof. The T$_g$-lowering monomer lowers the T$_g$ of the first block of the BCP.

The "monomer other than methyl methacrylate" that can be included in the first block include those selected from the group consisting of ethyl methacrylate, methyl acrylate, and mixtures thereof.

The molar percentage of T$_g$-lowering monomer in the first block of this embodiment can be from about 5% to about 90%, preferably from about 10% to about 80%, and more preferably from about 10% to about 60%. The molar percentage of methyl methacrylate in the first block of this embodiment can be from about 5% to about 90%, preferably from about 10% to about 80%, and more preferably from about 10% to about 60%. The molar percentage of the monomer other than methyl methacrylate in the first block of this embodiment can be from about 5% to about 90%, preferably from about 10% to about 60%, and more preferably from about 10% to about 40%. These molar percentages are based on the first block taken as 100%.

In this embodiment, the second block is a polymer comprising random monomers selected from the group consisting of styrene, styrene-containing monomers (such as alkyl (preferably C$_1$-C$_6$) styrenes, alkoxy (preferably C$_1$-C$_6$) styrenes, trimethylsilylstyrene, methyl styrene, tert-butylstyrene, dimethyl styrene, trimethylstyrene, methoxy styrene, fluorostyrenes, difluorostyrenes, pentafluorostyrene, trifluoromethylstyrene, benzhydrylstyrene), vinylbiphenyls, vinylbenzocyclobutene, vinyl naphthalenes, vinylphenanthrenes, vinylthiophene, vinylanisole, vinylanthracene, vinylpyridines, alkyl (preferably C$_1$-C$_6$) vinylbenzyl ethers, vinylbenzyl ether monomers, 9-(4-vinylbenzyl)-9H-carbazole, and combinations thereof.

3. Combination Styrene and Methacrylate Embodiment

In a particularly preferred embodiment, one of the first and second blocks is the styrene embodiment described above, while the other of the first and second blocks is the methacrylate embodiment described above. That is, one of the first and second blocks is a polymer comprising random monomers of styrene, a monomer other than styrene, and a T$_g$-lowering monomer selected as described above with respect to this embodiment, while the other of the first and second blocks is a polymer comprising random monomers of methyl methacrylate, a monomer other than methyl methacrylate, and a T$_g$-lowering monomer selected as described above with respect to this embodiment. The corresponding monomers and molar percentages described above also apply to this embodiment.

4. Polymerization Methods

Suitable blocks for the BCPs can be created by using reversible-deactivation radical polymerization techniques, including, but not limited to, reversible addition fragmentation chain transfer (RAFT), and atom transfer radical polymerization (ATRP), stable free radical mediated polymerization (SFRP), nitroxide mediated radical polymerization (NMP), or combinations thereof. Scheme A shows a general reaction using RAFT polymerization to create a random copolymer. A typical RAFT polymerization uses a radical initiator, a chain transfer agent (i.e. thiocarbonylthio compounds), selected monomers, and a solvent. The polymerization reaction is performed at a suitable temperature in an oxygen-free environment, and then is stopped at a point suitable to generate polymers with a well-controlled molecular weight.

Scheme A. General reaction methodology of RAFT to create random polymers

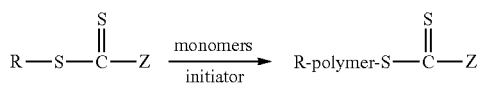

Suitable block copolymers can be created by using reversible-deactivation radical polymerization techniques, such as reversible addition fragmentation chain transfer (RAFT), atom transfer radical polymerization (ATRP), stable free radical mediated polymerization (SFRP), etc. RAFT is considered as the best suitable polymerization technique to prepare di-block copolymers in this invention. Scheme B shows a general reaction of using RAFT polymerization to create a block copolymer. The process to create a block copolymer utilizes a two-step reaction. First, one or more monomers (monomer A in Scheme B) is polymerized via RAFT polymerization in the presence of a radical initiator and a chain transfer agent (i.e. thiocarbonylthio compounds) to generate a polymer (polymer A in Scheme B) with a chain transfer agent moiety (i.e. thiocarbonylthio) at one chain end. The obtained polymer is then used as a macromolecular chain transfer agent in the second reaction, to effectuate the polymerization of a second monomer (monomer B in Scheme B) in the presence of a radical initiator to generate the block copolymer (A-B in Scheme B).

Scheme B. General reaction methodology of RAFT to create block polymers

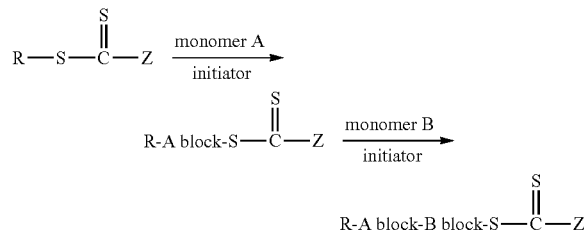

The resulting polymer is a block copolymer comprising two blocks, for example, an AB di-block copolymer.

Suitable radical initiators the RAFT polymerization method include, but are not limited to, 2,2'-azobis(2-methylpropionitrile) (AIBN), 4,4'-azobis(4-cyanovaleric acid) (ACVA), and 1,1'-azobis(cyclohexanecarbonitrile) (ACHN).

Suitable chain transfer agents include, but are not limited to, 2-cyano-2-propyl benzodithioate, 2-phenyl-2-propyl benzodithioate, 4-cyano-4-(phenylcarbonothioylthio)pentanoic acid, 2-cyano-2-propyl dodecyl trithiocarbonate, and 4-cyano-4-[(dodecylsulfanylthiocarbonyl)sulfanyl] pentanoic acid.

Suitable solvents include, but are not limited to, toluene, 1,4-dioxane, tetrahydrofuran, propylene glycol monomethyl ether acetate, and anisole.

5. Inventive Block Copolymer Properties

The inventive block copolymers have a number average molecular weight of from about 1,000 g/mol to about 100,000 g/mol, more preferably from about 5,000 g/mol to about 60,000 g/mol. Furthermore, the polydispersity index ("PDI") of the block copolymer is preferably from about from about 1.01 to about 1.50, more preferably from about 1.01 to about 1.25. As used herein, PDI is determined by GPC, using the following parameters: Mobile phase THF; Column—WATERS Styragel HR4, HR4E, HR 3, 708×300 mm; Flow rate—1.0 ml/min; Detector—RI; Column Temperature 40° C.; Polystyrene Standards used.

The inventive block copolymer has a $\chi$ value that is at least about 1.2 times, and preferably at least about 1.5 times the $\chi$ value of a polystyrene and poly(methyl methacrylate) block copolymer.

Furthermore, the inventive block copolymer has a $T_g$ (as used herein, determined by Differential Scanning Calorimetry) that is at least about 10% lower than (i.e., less than about 90% of), and preferably at least about 20% lower than (i.e., less than about 80% of) the $T_g$ of a polystyrene and poly(methyl methacrylate) block copolymer. When one of the blocks (could be first block, or could be second block in the combination embodiment) in the inventive block copolymer is the methacrylate embodiment block, that block preferably has a $T_g$ of from about 0° C. to about 120° C., and preferably from about 30° C. to about 100° C. When one of the blocks (could be first block, or could be second block in the combination embodiment) in the inventive block copolymer is the styrene embodiment block, that block preferably has a $T_g$ of from about 0° C. to about 100° C., and preferably from about 60° C. to about 85° C.

The ratio of the blocks in the copolymer varies depending on the desired self-assembly microstructures and properties of the polymer. "Volume ratio" as used herein is the ratio of the "volume" of each block of the polymer (where the volume is calculated by taking the molecular weight of that block of the polymer and dividing it by the density of that block of the polymer. When the structure being formed is a cylinder, the volume ratio of the first block to the second block will preferably be from about 80:20 to about 60:40, more preferably from about 40:60 to about 20:80. When the structure being formed is lamellae, the volume ratio of the first block to the second block is preferably from about 40:60 to about 60:40.

Inventive Compositions

The inventive compositions can include a number of optional ingredients, such as those selected from the group consisting of surfactants, acid catalysts, base catalysts, crosslinkers, polymers, and mixtures thereof. The DSA compositions are prepared by dissolving or dispersing the above-described block copolymer in a solvent system. Suitable solvents include those selected from the group consisting of propylene glycol monomethyl ether (PGME), propylene glycol monomethyl ether acetate (PGMEA), gamma-butyrolactone (GBL), cyclohexanone, cyclopentanone, ethyl lactate (EL), ethylacetoacetate (EAA), n-butyl acetate, methyl isobutyl carbinol (MIBC), 2-heptanone, isopropyl alcohol (IPA), methyl ethyl ketone (MEK), and mixtures thereof.

Preferred compositions will preferably have solids content of from about 0.1% to about 5%, more preferably from about 0.1% to about 2%, based upon the total weight of the composition taken as 100% by weight. The amount of block copolymer in the composition will generally fall into the above ranges as well, since it is most likely the primary (and possibly only) solid present in the composition.

Methods of Using Inventive Composition

The BCP is used in a DSA patterning scheme. In this process, the BCP is coated onto a series of underlayers and annealed to form the desired pattern. This pattern can be used in conjunction with pre-patterns, such as over a patterned photoresist or hardmask, or alone.

The BCP layer can be formed by any known application method, with one preferred method being spin-coating at speeds from about 500 to about 2500 rpm, preferably from about 1,000 to about 1,500 rpm, for a time period of from about 30 to about 90 seconds, preferably from about 50 to about 60 seconds. After the BCP layer is applied, thermal annealing is carried out by heating the layer to a temperature above its glass transition temperature. The heating is preferably carried out at a temperature from about 100° C. to about 300° C., and more preferably from about 110° C. to about 250° C., and for a time period of from about 30 seconds to about 1,800 seconds, preferably from about 60 seconds to about 600 seconds, to anneal the material. A second bake stage may be used to crosslink the material after microphase separation. The thickness of the BCP layer after baking is preferably from about 5 nm to about 80 nm, and more preferably from about 10 nm to about 50 nm, depending on the molecular weight of each polymer block.

In one embodiment, the self-assembly is carried out right after the DSA composition is applied. In other words, there are not any additional layers or other compositions applied on top of the DSA layer prior to annealing, as is the case in some prior art methods. Advantageously, the present invention provides for self-assembly to be carried out purely by thermal annealing. That is, some prior art methods require special other conditions, such as solvent annealing or annealing in an inert atmosphere, which are avoided by the use of the inventive DSA compositions.

In other embodiments, the BCP layer can be coated on top of a series of one or more underlayers selected from the group comprising bottom anti-reflective coatings, neutral brush layers, hardmask neutral layers (HM NLs), hardmasks, carbon-rich (e.g., spin-on carbon), or other layers. In some cases, a single layer, such as an HM NL, can perform the function of multiple layers, such as those of the BARC, the neutral brush layer and the hardmask.

1. Optional Hardmask Layer

The hardmask layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to about 75 seconds. Suitable hardmask layers are preferably high silicon content materials selected from the group consisting of silanes, siloxanes, and silsesquioxanes. Exemplary hardmask layers will generally comprise a polymer dissolved or dispersed in a solvent system, along with the following optional ingredients: surfactants, acid or base catalysts, and crosslinkers. Preferred compositions will preferably have solids content of from about 0.1% to about 70%, more preferably from about 0.5% to about 10%, and even more preferably from about 1% to about 2% by weight, based upon the total weight of the composition taken as 100% by weight. After the hardmask is applied, it is preferably heated to a temperature from about 100° C. to about 300° C., and more preferably from about 150° C. to about 250° C., and for a time period of from about 30 seconds to about 120 seconds, preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 100 nm. The hardmask layer should have an etch rate at least 0.75 times that of the block copolymer in a fluorine-rich plasma atmosphere and at least 5 times slower than the SOC in an oxygen-rich plasma etch atmosphere. The hardmask thickness should not be affected by the solvent when applying the BCP solution.

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and phenyltrimethoxysilane.

2. Optional Carbon-Rich Layer

The carbon-rich layer can be formed by any known application method, with one preferred method being spin-coating at speeds from about 1,000 to about 5,000 rpm, preferably from about 1,250 to about 1,750 rpm, for a time period of from about 30 to about 120 seconds, preferably from about 45 to 75 seconds. The term "carbon-rich" refers to layers formed from compositions comprising greater than about 50% by weight carbon, preferably greater than about 70% by weight carbon, and more preferably from about 75% to about 80% by weight carbon, based upon the total solids in the composition taken as 100% by weight. Suitable carbon-rich layers are selected from the group consisting of spin-on carbon layers ("SOC"), amorphous carbon layers, and carbon planarizing layers. Exemplary carbon-rich layers will generally compromise a polymer dissolved or dispersed in a solvent system, along with the following optional ingredients: acid and/or base quenchers, catalysts, crosslinking agents, and surface modification additives. Preferred compositions will be suitable for forming thick layers and preferably have solids content of from about 0.1% to about 70%, more preferably from about 5% to about 40%, and even more preferably from about 10% to about 30% by weight, based upon the total weight of the composition taken as 100% by weight. After the carbon-rich composition is applied, it is preferably heated to a temperature from about 100° C. to about 300° C., and more preferably from about 160° C. to about 250° C., and for a time period of from about 30 seconds to about 120 seconds, preferably from about 45 seconds to about 60 seconds, to evaporate solvents. The thickness of the carbon-rich layer after baking is preferably from about 10 nm to about 50,000 nm, more preferably from about 100 nm to about 5000 nm, and even more preferably from about 500 nm to about 1500 nm.

The substrate is preferably a semiconductor substrate, such as silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Optional intermediate layers may be formed on the substrate prior to processing.

3. Alternative Application Methods
a. Graphoepitaxy

While the previously-described BCP application method is a preferred embodiment, it will be appreciated that there are a number of variations that could be carried out as well. These variations are described and shown in detail in U.S. Patent Application No. 2013/0273330, incorporated by reference. For example, the invention could be utilized in lithography-assisted (e.g., graphoepitaxy) self-assembly. In summary, a stack is prepared as described above, using a substrate, optional intermediate layer (e.g., carbon-rich layer), and hardmask layer. An imaging layer is formed on the cured hardmask layer following conventional methods. Suitable photosensitive compositions for use as the imaging layer include any composition that can be patterned upon exposure to at least about 1 mJ/cm$^2$ radiation, such as photoresists, anti-reflective imaging layers, and the like.

The imaging layer can then be post-application baked ("PAB") at a temperature of at least about 80° C., and preferably from about 100° C. to about 140° C., for time periods of from about 10 seconds to about 120 seconds (preferably from about 30 seconds to about 60 seconds). The thickness of the imaging layer is preferably from about 10 nm to about 300 nm, more preferably from about 20 nm to about 150 nm, and even more preferably from about 30 nm to about 100 nm.

That imaging layer can then be patterned, for example, by exposure to radiation (e.g., light in the case of optical lithography) of the appropriate wavelength, followed by development of the unexposed portions of the imaging layer, again following conventional methods. For example, the imaging layer could be exposed using a mask positioned above the imaging layer. The mask has open areas designed to permit radiation (hv) to pass through the mask and contact the imaging layer to yield exposed portions of the imaging layer that are rendered insoluble in solvent (when using a negative-tone photoresist). The remaining solid portions of the mask are designed to prevent radiation from contacting the imaging layer in certain areas to yield unexposed portions of the imaging layer that remain solvent soluble. Those skilled in the art will readily understand that the arrangement of open areas and solid portions is designed based upon the desired pattern to be formed in the imaging layer, although the present method is particularly suited for dark-field exposure where the majority of the imaging layer is shielded from radiation to form raised features such as lines and pillars.

After exposure, the imaging layer is preferably subjected to a post-exposure bake ("PEB") at a temperature of from about 80° C. to about 150° C., more preferably from about 100° C. to about 130° C., for a time period of from about 30 seconds to about 60 seconds. Upon exposure, the portions of the imaging layer that are exposed to radiation are rendered insoluble in organic (preferably non-alkaline) solvent developer. The exposed imaging layer is then contacted with solvent to remove the unexposed portions to form the desired "pre-pattern" in the imaging layer. Alternatively, when using a positive-tone photoresist, the exposed portions of the imaging layer can be rendered soluble in aqueous developer (e.g., an alkaline developer) or solvent during the exposure process, in which case, the removal process is reversed from what is described above. That is, the exposed portions are removed during development to form the pattern (not shown).

In either embodiment, at least about 95% of the unexposed (or exposed, as the case may be) portions of the imaging layer will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

Thus, pre-pattern formation results in portions of the hardmask layer underneath the imaging layer being uncovered or exposed when those selected portions of the imaging layer are removed from the stack. The resulting pre-pattern preferably comprises raised features (e.g., lines, pillars, square islands, or combinations thereof) formed on the hardmask layer. These features are chemically identical to the exposed portions of the imaging layer and are each defined by respective sidewalls and respective top surfaces. It will be appreciated that in alternative embodiments, any other suitable patterning process may be used to pattern the imaging layer and form raised features, including multiple patterning processes, as well as immersion lithography. As mentioned above, it will also be appreciated that a positive-tone resist or photosensitive material could also be used, instead of the negative-tone imaging layer described herein. In that case, the unexposed portions of the imaging layer remain insoluble, while the exposed portions are rendered soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, once the desired pre-pattern is formed, a DSA composition according to the invention can be applied to the patterned stack, such that it flows into the spaces between the raised features (i.e., directly adjacent the hardmask), and adjacent the sidewalls of the raised features. In one or more embodiments, the self-assembling composition can also overcoat the top surfaces of the raised features. However, in other embodiments, the self-assembling composition preferably does not overcoat the top of the raised features. In other words, the self-assembling composition is deposited between the raised features and adjacent the feature sidewalls but is absent from the top surfaces of the raised features. As a result, the top surface of the raised features remains open to be easily removed via solvent removal or etching, without the need for an etch-back step or other modification of the self-assembling layer to expose the pre-pattern. The DSA composition can then be self-assembled or annealed as described above to yield first self-assembled regions and second self-assembled regions in the self-assembled or annealed layer, with one of the first or second self-assembled regions being adjacent the raised feature sidewalls, and the other of the first or second self-assembled regions segregated away from the raised features.

Either of the first or second self-assembled regions can then be removed to generate a pattern. For example, the first self-assembled region can then be removed to generate a pattern in the DSA layer on the patterned stack, followed by transferring this pattern down into the hardmask and carbon-rich intermediate layer. It will be appreciated that instead of the first self-assembled region, the second self-assembled region could be removed instead. Regardless, the resulting pattern is eventually transferred down into the substrate. The pattern will typically be comprised of features such as lines, spaces, cylinders, and/or holes. Advantageously, these features will have an average (mean) respective feature size of less than about 20 nm, preferably less than about 15 nm, more preferably less than about 10 nm, and even more preferably from about 1 nm to about 10 nm. The term "feature size," as used herein, refers to the average (mean) width of the features as measured on an SEM cross-section of the stack (thus in the case of holes the width is the same as the hole diameter).

b. Chemoepitaxy I

In another embodiment, chemoepitaxy could be used to guide the DSA pattern. In one chemoepitaxy process flow, a stack is prepared comprising a substrate, optional intermediate layer, switchable underlayer, and imaging layer, as described above. A pre-pattern is created in the imaging layer, either using the method described previously, or any other conventional method. Thus, pre-pattern formation results in portions of the underlayer beneath the imaging layer being uncovered or exposed when those selected portions of the imaging layer are removed from the stack. The remaining portions of the imaging layer adjacent the underlayer serve as a mask for surface modification of the underlayer. In one or more embodiments, the imaging layer is patterned using optical lithography and a developer (e.g., alkaline developer) or solvent rinse. Alternatively, the imaging layer is patterned using another suitable method, followed by contact with a developer solution (e.g., alkaline developer) or solvent. Regardless, the exposed portions of the underlayer are contacted with a developer solution (separately or during developer rinse). The remaining portions of the imaging layer are then removed (e.g., with solvent), yielding the underlayer having surface-modified regions and non-modified regions, where the surface-modified regions correspond to those portions of the underlayer that were uncovered during patterning of the imaging layer. Advantageously, contact with the developer (and particularly with an alkaline developer) changes the surface energy of the underlayer. In one or more embodiments, the surface energy is increased and causes the surface-modified regions of the underlayer to lose their ability to act as a neutral layer and induce alignment during the self-assembly process. However, the non-modified regions of the underlayer, which remained covered by the imaging layer during patterning and developer contact, still retain their neutral layer properties. Thus, the surface-modified regions correspond to non-aligning areas while the non-modified regions correspond to aligning areas on the underlayer. The active aligning areas therefore have the ability to become guiding structures for pattern formation during self-assembly.

c. Chemoepitaxy II

In a second chemoepitaxy process flow, a stack is prepared comprising a substrate, optional intermediate layer, and a switchable underlayer. In this process, the switchable underlayer is exposed directly, yielding an underlayer having surface-modified regions and non-modified regions, where the surface-modified regions correspond to those that were exposed. Advantageously, the exposure changes the surface energy of the underlayer. In one or more embodiments, the surface energy is increased and causes the surface-modified regions of the underlayer to lose their ability to act as a neutral layer and induce alignment during the self-assembly process. However, the non-modified regions of the underlayer, which remained covered by the imaging layer during patterning and developer contact, still retain their neutral layer properties. Thus, the surface-modified regions correspond to non-aligning areas while the non-modified regions correspond to aligning areas on the underlayer. The active aligning areas therefore have the ability to become guiding structures for pattern formation during self-assembly.

A DSA layer is then formed directly on top of the surface-modified underlayer, such that there is direct contact between the DSA layer and surface-modified regions and non-modified regions. The DSA layer is then self-assembled as described above to allow the components to self-assemble. Because of the surface modification, the self-assembling layer will only self-assemble into first self-assembled regions and second self-assembled regions in those portions of the DSA layer that are adjacent the non-modified areas of the underlayer. In other words, portions of the DSA layer adjacent the surface-modified areas of the underlayer do not separate or segregate into a pattern during annealing or self-assembly and are "unassembled" or "non-aligned." It will be appreciated that alternatively, the surface-modified regions and non-modified regions could be reversed, that is, that the surface-modified regions may allow the DSA layer to self-assemble, while the non-modified regions may cause the DSA layer to be "unassembled" or "non-aligned." One of the first or second self-assembled regions can then be selectively removed, followed by etching the resulting pattern into the underlayer and optional intermediate layer. This pattern is eventually transferred down into the substrate. In embodiments where a switchable underlayer is not utilized, an intermediate layer is required that will form modified and non-modified areas or regions, and the rest of the process would proceed as described above.

Regardless of the application method, it will be appreciated that in each of the foregoing methods, self-assembly or annealing results in nanophase separation in the DSA layer, which permits the formation of nanometer-sized patterns generally not achievable using conventional optical lithography techniques. It will also be appreciated that although the present methods illustrate formation of at least two distinct annealed or self-assembled regions in the DSA layer, it is envisioned that additional DSA materials could be formulated that are capable of separation into more than two distinct phases, including third and fourth annealed or self-assembled regions. A $L_0$ range of from about 12 to about 40 nm can be achieved by lamellae-forming BCPs. Additionally, line-space features of from about 6 to about 20 nm (identified by SEM) can be achieved. A size range of from about 6-nm to about 20-nm cylinder structures, e.g., holes or pillars, can also be achieved by the inventive cylinder-forming block copolymers. Perpendicular orientation of these BCPs can be achieved by thermal annealing alone a short time.

The developed BCPs provide the advantages of balanced surface energy between the polymer blocks, and tunable $\chi$ and glass transition temperature ($T_g$). The balanced surface energy between the polymer blocks enables the BCP to achieve perpendicular orientation by simple thermal annealing, without the need for solvent annealing or a top-coat. The $\chi$ value can be tuned up to achieve a $L_o$(BCP natural pitch) as low as 12 nm for lamellar-structured BCPs and hole/pillar size as small as 6 nm for cylinder-structured BCPs. The $T_g$ of BCPs can be tuned in the range of 10-90° C., at least 20° C. lower than those of PS-b-PMMA. Enhanced polymer chain mobility facilitated by decreasing the $T_g$ of the BCPs can also improve the kinetics of BCP self-assembly during thermal annealing.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of P(MMA-r-MEMA)-b-P(S-TMVB-r-MS)

The first block of the BCP was synthesized by adding 40 grams of methyl methacrylate ("MMA," Sigma Aldrich, St Louis, Mo.), 20 grams of 2-methoxy ethyl methacrylate ("MEMA," Sigma Aldrich, St Louis, Mo.), 0.227 grams of 2-cyano-2-propyl benzodithioate (Strem Chemicals Inc., Newburyport, Mass.), 0.025 grams of 2,2'-azobis(2-methylpropionitrile) (Sigma Aldrich, St Louis, Mo.), and 50 grams of toluene (Sigma Aldrich, St Louis, Mo.) to a round bottom flask and purged for 30 minutes with nitrogen flow. The reaction was heated at 60° C. for 16 hours before being cooled to room temperature, diluted with 30 grams of acetone (Sigma Aldrich, St Louis, Mo.) and precipitated into 800 milliliters of hexanes (Alfa Aesar, Ward Hill, Mass.). The resulting solid was collected by vacuum filtration and dried under vacuum overnight at 45° C. Finally, 11.8 grams of P(MMA-r-MEMA) was collected and analyzed by GPC to be 11.4 kg/mol relative to PS standards, with a PDI of 1.12.

The second block of the BCP was formulated using chain extension from the P(MMA-r-MEMA) polymer. This involved mixing 3.0 grams of the P(MMA-r-MEMA) with 3.12 grams of styrene ("S," Sigma Aldrich, St Louis, Mo.), 2.24 grams of 1-(4-tolyloxymethyl)-4-vinylbenzene ("TMVB," Wuxi Vsparkle International Trading Co., Ltd., Yiking, Jiangsu, China), 1.18 grams of 4-methyl styrene (MS, Sigma Aldrich, St Louis, Mo.), 0.004 grams of 2,2'-azobis(2-methylpropionitrile) (Sigma Aldrich, St Louis, Mo.), and 10 grams of toluene (Sigma Aldrich, St Louis, Mo.). The solution was purged with nitrogen for 30 minutes and heated to 80° C. for 16 hours before being cooled to room temperature. The reaction mixture was then diluted with acetone (Sigma Aldrich, St Louis, Mo.) and precipitated into a 1:1 (v/v) mixture of cyclohexane (Alfa Aesar, Ward Hill, Mass.) to hexane (Alfa Aesar, Ward Hill, Mass.). The resulting solid was collected by vacuum filtration and dried under vacuum overnight at 45° C. After drying, 5.5 grams of the prepared block copolymer, P(MMA-r-MEMA)-b-P(S-TMVB-r-MS), was collected and analyzed by GPC to be 20.8 kg/mol relative to PS standards, with a PDI of 1.12.

Example 2

Synthesis of P(MMA-r-MEMA)-b-P(S-TMVB-r-MS)

The first block of the BCP was synthesized by adding 30 grams of methyl methacrylate, 15 grams of 2-methoxy ethyl methacrylate, 0.227 grams of 2-cyano-2-propyl benzodithioate, 0.025 grams of 2,2'-azobis(2-methylpropionitrile), and 50 grams of toluene to a round bottom flask and purged for 30 minutes with nitrogen flow. The reaction was heated at 60° C. for 16 hours before being cooled to room temperature, diluted with 30 grams of acetone, and precipitated into 800 milliliters of hexanes. The resulting solid was collected by vacuum filtration and dried under vacuum overnight at 45° C. Finally, 11.8 grams of P(MMA-r-MEMA) was collected and analyzed by GPC to be 11.8 kg/mol relative to PS standards, with a PDI of 1.14.

The second block of the BCP was formulated using chain extension from the P(MMA-r-MEMA) polymer. This involved mixing 3.0 grams of the P(MMA-r-MEMA) with 1.56 grams of styrene, 3.36 grams of 1-(4-tolyloxymethyl)-4-vinylbenzene, 2.36 grams of 4-methyl styrene, 0.004 grams of 2,2'-azobis(2-methylpropionitrile), and 10 grams of toluene. The solution was purged with nitrogen for 30 minutes and heated to 80° C. for 16 hours before being cooled to room temperature. The reaction mixture was then diluted with acetone and precipitated into a 1:1 (v/v) mixture of cyclohexane (Alfa Aesar, Ward Hill, Mass.) to hexane (Alfa Aesar, Ward Hill, Mass.). The resulting solid was collected by vacuum filtration and dried under vacuum overnight at 45° C. After drying, 5.5 grams of the prepared block copolymer, P(MMA-r-MEMA)-b-P(S-TMVB-r-MS), was collected and analyzed by GPC to be 20.9 kg/mol relative to PS standards, with a PDI of 1.11.

Example 3

Synthesis of Comparative Block Copolymer Example

In this procedure, 50 grams of methyl methacrylate, 0.227 gram of 2-cyano-2-propyl benzodithioate, 0.025 gram of 2,2'-azobis(2-methylpropionitrile), and 50 grams of toluene were added to a round bottom flask and purged for 30 minutes with nitrogen flow. The reaction was heated at 60° C. for 16 hours before being cooled to room temperature, diluted with 30 grams of acetone, and precipitated into 800 milliliters of hexanes. The resulting solid was collected by vacuum filtration and dried under vacuum overnight at 45° C. After drying, 11.8 grams of PMMA were collected and analyzed by GPC to be 11.7 kg/mol relative to PS standards with a PDI of 1.14.

Next, 3.0 grams of the PMMA prepared above was mixed with 3.12 grams of styrene, 3.6 grams of 4-vinylbiphenyl (VBP, Sigma Aldrich, St Louis, Mo.), 2.36 grams of 4-methyl styrene, 0.004 gram of 2,2'-azobis(2-methylpropionitrile), and 10 grams of toluene. The mixture was purged with nitrogen for 30 minutes and heated to 80° C. for 16 hours before being cooled to room temperature. The reaction mixture was then diluted with acetone and precipitated into hexane. The resulting solid was collected by vacuum filtration and dried under vacuum overnight at 45° C. After drying, 5.5 grams of PMMA-b-P(S-r-VBP-r-MS) was collected and analyzed by GPC to be 20.6 kg/mol relative to PS standards with a PDI of 1.11.

Example 4

Synthesis of P(MMA-r-MEMA-r-MA)-b-P(S-TMVB-r-MS)

The first block of the BCP was synthesized by adding 50 grams of methyl methacrylate, 25 grams of 2-methoxy ethyl methacrylate, 25 grams of methyl acrylate (MA, Sigma Aldrich, St Louis, Mo.), 0.227 grams of 2-cyano-2-propyl benzodithioate, 0.025 grams of 2,2'-azobis(2-methylpropionitrile), and 80 grams of toluene to a round bottom flask and purged for 30 minutes with nitrogen flow. The reaction was heated at 60° C. for 16 hours before being cooled to room temperature, diluted with 30 grams of acetone and precipitated into 1000 milliliters of hexanes. The resulting solid was collected by vacuum filtration and dried under vacuum overnight at 45° C. After drying, 22.4 grams of P(MMA-r-MEMA-r-MA) was collected and analyzed by GPC to be 22.1 kg/mol relative to PS standards, with a PDI of 1.14.

The second block of the BCP was formulated using chain extension from the P(MMA-r-MEMA-r-MA) polymer. This was accomplished by mixing 3.0 grams of the P(MMA-r-MEMA-r-MA) with 3.12 grams of styrene, 2.24 grams of 1-(4-tolyloxymethyl)-4-vinylbenzene, 1.18 grams of 4-methyl styrene, 0.004 grams of 2,2'-azobis(2-methylpropionitrile), and 10 grams of toluene. The solution was purged with nitrogen for 30 minutes and heated to 80° C. for 16 hours before being cooled to room temperature. The reaction mixture was then diluted with acetone and precipitated into a 1:1 (v/v) mixture of cyclohexane to hexane. The resulting solid was collected by vacuum filtration and dried under vacuum overnight at 45° C. After drying, 5.6 grams of the prepared block copolymer, P(MMA-r-MEMA-r-MA)-b-P(S-TMVB-r-MS), was collected and analyzed by GPC to be 39.8 kg/mol relative to PS standards, with a PDI of 1.18.

Example 5

Synthesis of Comparative PS-b-PMMA Block Copolymer

In this procedure, 60 grams of methacrylate, 0.227 gram of 2-cyano-2-propyl benzodithioate, 0.025 gram of 2,2'-azobis(2-methylpropionitrile), and 50 grams of toluene were added to a round bottom flask and purged for 30 minutes with nitrogen flow. The reaction was heated at 60° C. for 20 hours before being cooled to room temperature, diluted with 30 grams of acetone and precipitated into 800 milliliters of hexanes. The resulting solid was collected by vacuum filtration and dried under vacuum overnight at 45° C. Finally, 22.4 grams of PMMA were collected and analyzed by GPC to be 22.9 kg/mol relative to PS standards with a PDI of 1.14.

Next, 3.0 grams of the PMMA obtained above was mixed with 16.0 grams of styrene, 0.004 gram of 2,2'-azobis(2-methylpropionitrile), and 10 grams of toluene. The mixture was purged with nitrogen for 30 minutes and heated to 80° C. for 16 hours before being cooled to room temperature. The reaction mixture was then diluted with acetone and precipitated into hexane. The resulting solid was collected by vacuum filtration and dried under vacuum overnight at 45° C. After drying, 5.4 grams of PMMA-b-PS was collected and analyzed by GPC to be 39.9 kg/mol relative to PS standards with a PDI of 1.17.

Example 6

Block Copolymer Properties

The glass transition temperatures ($T_g$) of the individual blocks of the formulated BCPs were determined using differential scanning calorimetry (DSC). Table 1 lists the properties of the block copolymers formulated in Examples 1-5.

TABLE 1

| | Properties of BCPs of Examples 1-5 | | | | | |
|---|---|---|---|---|---|---|
| BCPs | $T_g$ (MMA as First Block Embodiment, ° C.) | $T_g$ (Styrene as First Block Embodiment, ° C.) | $M_n$ (MMA as First Block Embodiment, Da) | $M_n$ (BCP, Da) | PDI | $L_0$ (nm) |
| Example 1 | 85 | 90 | 11,400 | 20,800 | 1.12 | 18.0 |
| Example 2 | 70 | 85 | 11,800 | 20,900 | 1.11 | 18.3 |
| Example 3 | 115 | 115 | 11,700 | 20,600 | 1.11 | 18.2 |
| Example 4 | 65 | 84 | 22,100 | 39,800 | 1.18 | 29.9 |
| Example 5 | 120 | 101 | 22,900 | 39,900 | 1.17 | 30.4 |

Example 6

Self-Assembly Testing

Silicon wafers were prepared for self-assembly by first spin coating a 0.5 wt % solution of hydroxyl-terminated random copolymer of P(S-r-MMA) comprising 50% styrene and 50% MMA in PGMEA (Heraeus Precious Metals North America, Vandalia, Ohio) onto the wafers at 1,500 rpm for 60 seconds. The resulting ~12-nm-thick film was annealed at 250° C. on a hotplate for 5 minutes and then stripped with PGMEA by puddling the PGMEA for 30 seconds and then spin drying to remove unreacted brush material. The treated wafer was then coated with each BCP (1.2 wt % in PGMEA) and baked at 180° C. for 5 minutes to complete the self-assembly process. The resulting BCP film was then etched in an oxygen plasma using the following parameters: 100 W power, 50 mtorr chamber pressure, and 30 sccm of $O_2$ for 5 seconds.

FIG. 1 shows SEM images of the block copolymer from Example 1, the block copolymer from Example 2, and the comparative block copolymer from Example 3. All the BCPs were thermally annealed at 180° C. for 5 minutes. As compared to the comparative BCP from Example 3, the BCPs from Examples 1 and 2 show longer-range ordering. FIG. 2 shows SEM images of the BCPs from Example 4 and comparative PS-b-PMMA from Example 5. The BCP from Example 4, with lower $T_g$, produces perpendicularly oriented lamellar structure in a short time (minutes) at low temperatures, (140-200° C.), while standard PS-b-PMMA could not form perpendicularly oriented self-assembly structure or needed a long annealing time.

Table 2 lists analysis results of SEM images including the defect density, LER, and correlation length the BCPs from Examples 1-5. These were each determined using ImageJ software with a plugin, as explained by Murphy J N, Harris K D, Buriak J M (2015), Automated Defect and Correlation Length Analysis of Block Copolymer Thin Film Nanopatterns. PLoS ONE 10(7): e0133088. https://doi.org/10.1371/ journal.pone.0133088, incorporate by reference herein. The BCPs from Examples 1, 2, and 4 have lower defect density compared with the comparative BCPs from Example 3 and 5, due to their lower $T_g$.

TABLE 2

Self-assembly Analysis of SEM Images

| Platform | $L_0$ (nm) | Correlation Length (nm) | Line Edge Roughness (3σ LER, nm) | Defect Density/ $\mu m^2$ |
|---|---|---|---|---|
| Example 1 | 18.0 | 102.0 | 2.5 | 87.3 |
| Example 2 | 18.3 | 112.5 | 2.4 | 91.2 |
| Example 3 | 18.2 | 59.6 | 2.9 | 169.9 |
| Example 4 | 29.9 | 90.2 | 3.2 | 79.1 |
| Example 5 | 30.4 | 60.1 | 3.6 | 132.0 |

I claim:

1. A method of forming a microelectronic structure, said method comprising:
   providing a stack comprising:
      a substrate having a surface; and
      one or more optional intermediate layers on said substrate surface;
   applying a composition to said intermediate layers, if present, or to said substrate surface, if no intermediate layers are present, said composition comprising a block copolymer comprising a first block and a second block, wherein said block copolymer is capable of forming features in the range of from about 6 to about 20 nm when the structure being formed is a line, space, or cylinder, said first block being selected from the group consisting of:
      (I) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and
      (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, ethyl acrylate, methyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof; and
   causing said composition to self-assemble into a self-assembled layer, wherein said self-assembled layer comprises a first self-assembled region and a second self-assembled region different from said first self-assembled region.

2. The method of claim 1, wherein said first block is polymer (I) and said monomer other than styrene is selected from the group consisting of 2-methyl styrene, 3-methyl styrene, 4-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluorostyrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, and mixtures thereof.

3. The method of claim 1, wherein said block copolymer has a glass transition temperature ($T_g$) in the range of from 0° C. to 120° C.

4. The method of claim 1, wherein said first block is polymer (I) and said second block is poly(methyl methacrylate).

5. The method of claim 1, wherein said first block is polymer (II) and said second block is poly(styrene).

6. The method of claim 1, wherein said causing comprises heating said composition to at least about the glass transition temperature of said block copolymer, said self-assembling occurring during said heating.

7. The method of claim 1, wherein said stack comprises an intermediate layer selected from the group consisting of bottom anti-reflective coatings, neutral brush layers, hardmask neutral layers, hardmasks, spin-on carbon layers, etch block layers, and imaging layers.

8. The method of claim 1, wherein said substrate is a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, and mixtures of the foregoing.

9. The method of claim 1, wherein said first block is polymer (I) and said second block is polymer (II).

10. The method of claim 1, further comprising removing one of said self-assembled regions to yield a pattern in said self-assembled layer.

11. The method of claim 10, further comprising transferring said pattern into said one or more intermediate layers, if present, and into said substrate, wherein said pattern comprises a plurality of features selected from the group consisting of trenches, spaces, via holes, contact holes having an average feature size of less than about 20 nm.

12. The method of claim 1, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

13. The method of claim 12, wherein said plurality of raised features are formed by:
   applying a photosensitive composition to form an imaging layer on any other intermediate layer, if present, or on said substrate surface, if no other intermediate layers are present; and
   patterning said imaging layer to yield said pre-pattern, before applying said composition to said imaging layer.

14. The method of claim 13, wherein said patterning comprises:
   exposing said imaging layer to radiation to yield exposed and unexposed portions of said imaging layer; and
   contacting said imaging layer with a developer so as to remove one of said exposed or unexposed portions.

15. The method of claim 1, wherein at least one intermediate layer is present, said intermediate layer being selected from the group consisting of hardmask layers and neutral layers, and wherein said intermediate layer comprises a surface having surface-modified regions and non-modified regions, said first and second self-assembled regions being adjacent said non-modified regions.

16. The method of claim 15, wherein before applying said composition to said intermediate layer, said surface-modified regions and non-modified regions are formed by:
   forming an imaging layer on said intermediate layer;
   patterning said imaging layer to yield a pre-pattern, wherein said patterning comprises selectively removing portions of said imaging layer to uncover portions of said intermediate layer;
   contacting said uncovered portions of intermediate layer with a developer or solvent to yield said surface-modified regions; and
   removing remaining portions of said imaging layer from said intermediate layer to yield said non-modified regions.

17. The method of claim 15, wherein before applying said composition to said intermediate layer, said surface-modified regions and non-modified regions are formed by selectively exposing said intermediate layer to radiation.

18. The method of claim 1, wherein said causing is carried out after said applying, without applying a further layer being formed on, or a second composition being applied to, said composition.

19. A microelectronic structure comprising:
   a substrate having a surface;
   one or more optional intermediate layers on said substrate surface; and
   a layer of a self-assembling composition formed on said one or more optional intermediate layers, if present, or on said substrate surface, if no intermediate layers are present, said self-assembling composition comprising a block copolymer comprising a first block and a second block, said first block being selected from the group consisting of:
   (I) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and
   (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof,
   wherein said block copolymer is capable of forming features in the range of from about 6 to about 20 nm when the structure being formed is a line, space, or cylinder.

20. The structure of claim 19, wherein said first block is polymer (I) and said monomer other than styrene is selected from the group consisting of 2-methyl styrene, 3-methyl styrene, 4-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluoro styrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, and mixtures thereof.

21. The structure of claim 19, wherein said block copolymer has a glass transition temperature ($T_g$) in the range of from 0° C. to 120° C.

22. The structure of claim 19, wherein said first block is polymer (I) and said second block is poly(methyl methacrylate).

23. The structure of claim 19, wherein said first block is polymer (II) and said second block is poly(styrene).

24. The structure of claim 19, wherein said substrate is a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

25. The structure of claim 19, wherein said first block is polymer (I) and said second block is polymer (II).

26. The structure of claim 19, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

27. A composition comprising a block copolymer dissolved or dispersed in a solvent system, said block copolymer comprising:
   a first block selected from the group consisting of:
   (I) a polymer comprising random monomers of styrene, a monomer other than styrene, and a monomer selected from the group consisting of 4-alkyl styrene, 3-alkyl styrene, 4-alkoxy styrene, 3-alkoxy styrene, alkyl vinylbenzyl ether, vinylbenzyl ether, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and
   (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof; and
a second block selected from the group consisting of:
the other of polymer (I) or (II); and
polymers comprising recurring monomers of methyl methacrylate, methacrylate-containing monomers, styrene, styrene-containing monomers, and mixtures thereof,
wherein said block copolymer is capable of forming features in the range of from about 6 to about 20 nm when the structure being formed is a line, space, or cylinder.

28. The composition of claim 27, wherein said first block is polymer (I) and said monomer other than styrene is selected from the group consisting of 2-methyl styrene, 3-methyl styrene, 4-methyl styrene, 3-vinylbiphenyl, 4-tert-butylstyrene, 2,4-dimethyl styrene, 3,4-dimethyl styrene, 2,5-dimethyl styrene, 3,5-dimethyl styrene, 2,4,6-trimethylstyrene, 4-methoxy styrene, 4-fluorostyrene, 3-fluorostyrene, 2-fluorostyrene, 2,3-difluorostyrene, 2,4-difluoro styrene, pentafluorostyrene, 4-vinylbiphenyl, 4-benzhydrylstyrene, 4-vinylbenzocyclobutene, 1-vinyl naphthalene, 2-vinyl naphthalene, 2-vinylphenanthrene, 9-vinylphenanthrene, 2-vinylthiophene, 9-vinylanthracene, and mixtures thereof.

29. The composition of claim 27, wherein said solvent system is selected from the group consisting of propylene glycol monomethyl ether, propylene glycol monomethyl ether acetate, gamma-butyrolactone, cyclohexanone, cyclopentanone, ethyl lactate, ethylacetoacetate, n-butyl acetate, methyl isobutyl carbinol, 2-heptanone, isopropyl alcohol, methyl ethyl ketone, mixtures thereof, and mixtures thereof.

30. A method of forming a microelectronic structure, said method comprising:
providing a stack comprising:
a substrate having a surface; and
one or more optional intermediate layers on said substrate surface;
applying a composition to said intermediate layers, if present, or to said substrate surface, if no intermediate layers are present, said composition comprising a block copolymer comprising a first block and a second block and having a glass transition temperature ($T_g$) in the range of from 0° C. to 120° C., said first block being selected from the group consisting of:
(III) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and
(IV) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, ethyl acrylate, methyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof; and
causing said composition to self-assemble into a self-assembled layer, wherein said self-assembled layer comprises a first self-assembled region and a second self-assembled region different from said first self-assembled region.

31. A microelectronic structure comprising:
a substrate having a surface;
one or more optional intermediate layers on said substrate surface; and
a layer of a self-assembling composition formed on said one or more optional intermediate layers, if present, or on said substrate surface, if no intermediate layers are present, said self-assembling composition comprising a block copolymer comprising a first block and a second block and having a glass transition temperature ($T_g$) in the range of from 0° C. to 120° C., said first block being selected from the group consisting of:
(III) a polymer comprising random monomers of styrene, a monomer other than styrene, and a monomer selected from the group consisting of 4-alkyl styrenes, 3-alkyl styrenes, 4-alkoxy styrenes, 3-alkoxy styrenes, alkyl vinylbenzyl ethers, vinylbenzyl ethers, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and
(IV) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof.

32. A composition comprising a block copolymer dissolved or dispersed in a solvent system, said block copolymer having a glass transition temperature ($T_g$) in the range of from 0° C. to 120° C. and comprising:
a first block selected from the group consisting of:
(I) a polymer comprising random monomers of styrene, a monomer other than styrene, and a monomer selected from the group consisting of 4-alkyl styrene, 3-alkyl styrene, 4-alkoxy styrene, 3-alkoxy styrene, alkyl vinylbenzyl ether, vinylbenzyl ether, and mixtures thereof, wherein said monomer other than styrene is selected from the group consisting of methyl styrene, dimethyl styrene, trimethylstyrene, methoxystyrene, tert-butylstyrene fluorostyrene, difluorostyrene, pentafluorostyrene, vinylbiphenyl, benzylhydrylstyrene, vinylbenzocyclobutene, vinyl naphthalene, vinylphenathrene, vinylthiophene, vinylanthracene, and mixtures thereof; and (II) a polymer comprising random monomers of methyl methacrylate, a monomer other than methyl methacrylate, and a monomer selected from the group consisting of 2-methoxy ethyl methacrylate, di(ethylene glycol) methyl ether methacrylate, poly(ethylene glycol) methacrylate, methyl acrylate, ethyl acrylate, 2-methoxy ethyl acrylate, di(ethylene glycol) methyl ether acrylate, poly(ethylene glycol) acrylate, and mixtures thereof, wherein said monomer other than methyl methacrylate is selected from the group consisting of ethyl methacrylate, methyl acrylate, and mixtures thereof; and a second block selected from the group consisting of:
  the other of polymer (I) or (II); and
  polymers comprising recurring monomers of methyl methacrylate, methacrylate-containing monomers, styrene, styrene-containing monomers, and mixtures thereof.

\* \* \* \* \*